United States Patent
Morgan

(10) Patent No.: US 9,500,321 B2
(45) Date of Patent: Nov. 22, 2016

(54) LED ILLUMINATION ASSEMBLY HAVING REMOTE CONTROL SYSTEM

(71) Applicant: Brian K. Morgan, Lee's Summit, MO (US)

(72) Inventor: Brian K. Morgan, Lee's Summit, MO (US)

( * ) Notice: Subject to any disclaimer, the term of this patent is extended or adjusted under 35 U.S.C. 154(b) by 201 days.

(21) Appl. No.: 14/148,681

(22) Filed: Jan. 6, 2014

(65) Prior Publication Data

US 2014/0119015 A1   May 1, 2014

Related U.S. Application Data

(63) Continuation-in-part of application No. 13/450,067, filed on Apr. 18, 2012, now Pat. No. 8,622,572, which is a continuation of application No. 13/372,297, filed on Feb. 13, 2012, now abandoned.

(60) Provisional application No. 61/442,035, filed on Feb. 11, 2011.

(51) Int. Cl.
| | |
|---|---|
| F21S 9/02 | (2006.01) |
| F21K 99/00 | (2016.01) |
| F21V 23/00 | (2015.01) |
| F21V 23/06 | (2006.01) |
| H05K 1/14 | (2006.01) |
| H05K 1/11 | (2006.01) |
| H05K 1/18 | (2006.01) |

(52) U.S. Cl.
CPC . *F21K 9/17* (2013.01); *F21K 9/30* (2013.01); *F21K 9/90* (2013.01); *F21S 9/02* (2013.01); *F21V 23/005* (2013.01); *F21V 23/06* (2013.01); *H05K 1/142* (2013.01); *H05K 1/117* (2013.01); *H05K 1/181* (2013.01); *H05K 2201/10106* (2013.01); *Y10T 29/4913* (2015.01)

(58) Field of Classification Search
CPC .................. F21Y 2103/003; F21Y 2105/001; F21S 4/008; F21S 9/022; F21S 9/024; F21V 23/0435; F21V 23/045
See application file for complete search history.

(56) References Cited

U.S. PATENT DOCUMENTS

| 5,952,789 A | 9/1999 | Stewart et al. |
| 6,283,612 B1 | 9/2001 | Hunter |

(Continued)

FOREIGN PATENT DOCUMENTS

WO    2009131340    10/2009

OTHER PUBLICATIONS

U.S. Appl. No. 13/450,067 select file history dated Jun. 18, 2013 through Nov. 27, 2013, 104 pages.

*Primary Examiner* — Ismael Negron
(74) *Attorney, Agent, or Firm* — Erise IP, P.A.

(57) ABSTRACT

An LED lighting assembly includes a plurality of light emitting didoes (LED) mounted on two or more printed circuit boards, a battery electrically connected to the LEDs, means for electrically connecting the LEDs to an external power source, and a switching system for selectively connecting the LEDs to the external power source of the battery in response to remotely generated. The printed circuit boards are secured to the mounting component of a conventional lighting fixture such that the LEDs are positioned to provide a light pattern similar to the conventional lighting fixtures.

12 Claims, 9 Drawing Sheets

(56) References Cited

U.S. PATENT DOCUMENTS

| | | |
|---|---|---|
| 6,608,453 B2 | 8/2003 | Morgan et al. |
| 6,739,734 B1 | 5/2004 | Hulgan |
| 6,762,562 B2 | 7/2004 | Leong |
| 6,860,628 B2 | 3/2005 | Robertson et al. |
| 6,997,576 B1 | 2/2006 | Lodhie et al. |
| 7,053,557 B2 | 5/2006 | Cross et al. |
| 7,064,498 B2 * | 6/2006 | Dowling ............... A61N 5/0616 315/291 |
| 7,086,747 B2 * | 8/2006 | Nielson ............... F21S 9/022 362/20 |
| 7,114,830 B2 | 10/2006 | Robertson et al. |
| 7,377,669 B2 | 5/2008 | Farmer et al. |
| 7,441,922 B2 | 10/2008 | Huang et al. |
| 7,488,086 B2 | 2/2009 | Wu et al. |
| 7,513,639 B2 | 4/2009 | Wang |
| 7,594,738 B1 | 9/2009 | Lin et al. |
| 7,665,862 B2 | 2/2010 | Villard |
| 7,712,918 B2 | 5/2010 | Siemiet et al. |
| 7,722,221 B2 | 5/2010 | Chae |
| 7,824,056 B2 | 11/2010 | Madireddi et al. |
| 7,871,180 B2 | 1/2011 | Wu et al. |
| 7,918,580 B2 * | 4/2011 | Liu ............... F21K 9/00 362/217.08 |
| 7,922,354 B2 | 4/2011 | Everhart |
| 7,954,979 B2 | 6/2011 | Sommers et al. |
| 7,976,196 B2 | 7/2011 | Ivey et al. |
| 8,033,686 B2 * | 10/2011 | Recker ............... H05B 33/0803 362/249.02 |
| 8,092,043 B2 | 1/2012 | Lin et al. |
| 8,362,713 B2 * | 1/2013 | Recker ............... H05B 33/0803 307/44 |
| 8,770,770 B2 * | 7/2014 | Shew ............... H02J 9/065 362/20 |
| 8,896,208 B2 * | 11/2014 | Shew ............... H02J 9/065 315/166 |
| 2006/0022214 A1 | 2/2006 | Morgan et al. |
| 2006/0285325 A1 | 12/2006 | Ducharme et al. |
| 2007/0223225 A1 | 9/2007 | Eiich et al. |
| 2008/0062689 A1 | 3/2008 | Villard |
| 2008/0266849 A1 | 10/2008 | Nielson et al. |
| 2010/0102729 A1 | 4/2010 | Katzir et al. |
| 2010/0106306 A1 | 4/2010 | Simon et al. |
| 2010/0117559 A1 * | 5/2010 | Lee ............... H05B 33/0803 315/294 |
| 2010/0270925 A1 * | 10/2010 | Withers ............... F21K 9/17 315/51 |
| 2011/0019398 A1 | 1/2011 | Bishop et al. |
| 2011/0117786 A1 | 5/2011 | Takata |
| 2011/0149563 A1 | 6/2011 | Hsia et al. |
| 2011/0176297 A1 | 7/2011 | Hsia et al. |
| 2011/0211330 A1 * | 9/2011 | Wang ............... F21V 29/767 362/20 |
| 2011/0292647 A1 * | 12/2011 | Chang ............... F21K 9/17 362/218 |
| 2012/0033420 A1 * | 2/2012 | Kim ............... F21K 9/17 362/235 |
| 2012/0170258 A1 * | 7/2012 | VanDuinen ............... F21S 4/008 362/217.02 |

\* cited by examiner

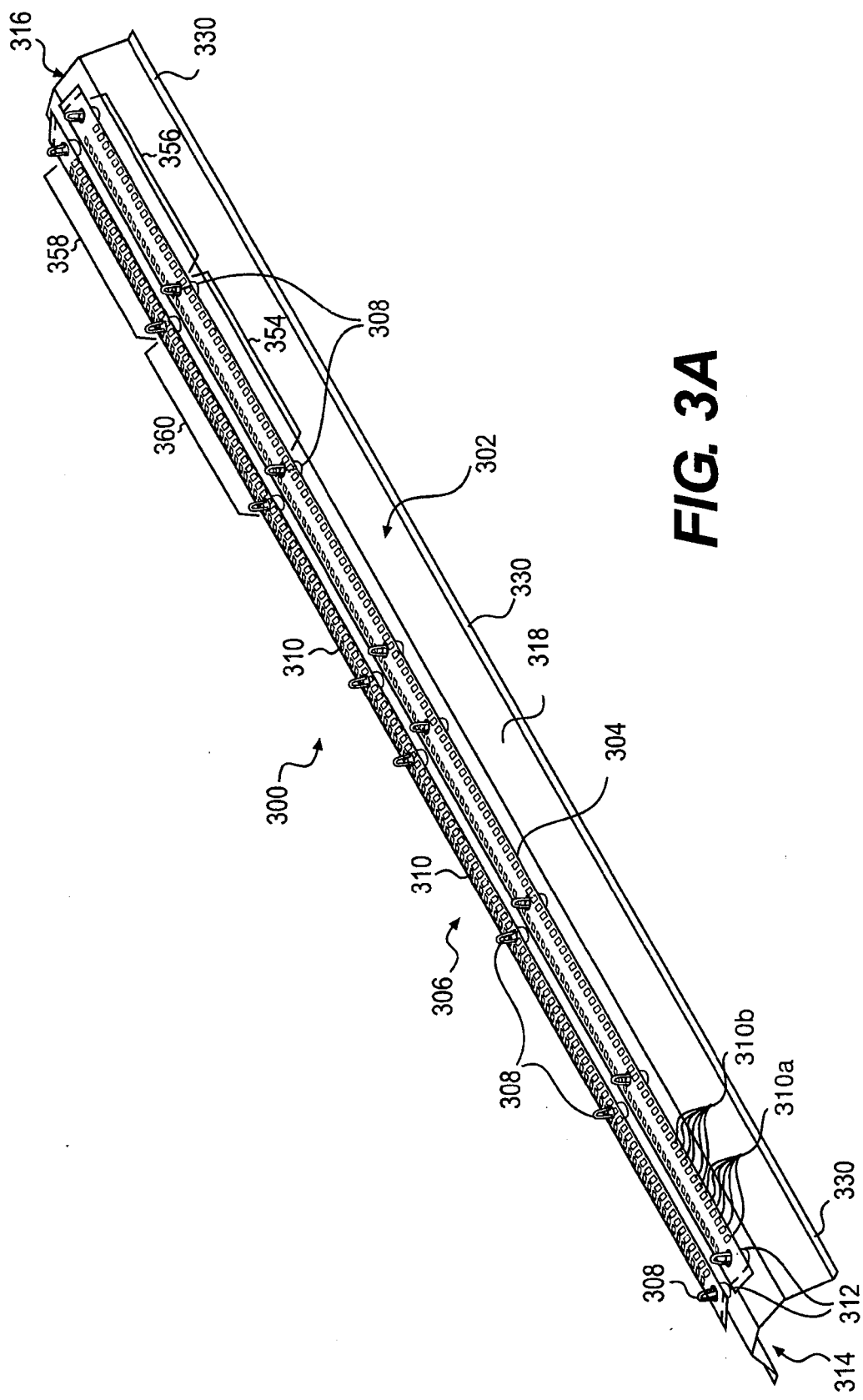

LED ILLUMINATION ASSEMBLY HAVING REMOTE CONTROL SYSTEM

CROSS-REFERENCE TO RELATED APPLICATIONS

This application is a continuation-in-part of U.S. patent application Ser. No. 13/450,067, filed Apr. 18, 2012 which is a continuation of U.S. patent application Ser. No. 13/372, 297, filed Feb. 13, 2012, which claims priority to U.S. Provisional Patent Application No. 61/442,035, filed on Feb. 11, 2011, the disclosures of which are hereby incorporated by reference in their entirety.

BACKGROUND OF THE INVENTION

1. Field of the Invention

The invention relates generally to the field of illumination. More specifically, the invention relates to the field of providing lighting using light emitting diodes to replace more conventional lighting systems.

2. Description of the Related Art

There are many devices used to retrofit conventional lighting fixtures, such as fluorescent lighting fixtures. For example, FIG. 1 depicts a conventional fluorescent lamp assembly 100 that exists in numerous buildings. The lamp assembly 100 includes a housing 102 and two parallel fluorescent lamp bulbs 104. Also included in the housing 102 is a rectangular protruding ballast cover 106. The cover 106 (which is removable) includes not only the ballast, but also the associated electronics equipment.

FIG. 2 shows another conventional fluorescent lamp arrangement 200 commonly found in buildings and other structures. The lamp arrangement 200 includes a housing 202 that contains four fluorescent bulbs 204. There is also a centrally located rectangular metal cover 206, which houses the ballast equipment and associated electronics.

These lamp assemblies may be updated in a variety of fashions, but are generally retrofit using non-fluorescent bulbs, such as bulbs having a similar size and shape of a fluorescent bulb. For example, a conventional lamp assembly may be retrofit by replacing a fluorescent tube with an LED-based tube of similar shape and size. However, although such a retrofit removes the drawbacks associated with the fluorescent tube, it does little to provide additional advantages or benefits.

These and other problems exist with respect to conventional lighting fixture retrofitting systems and procedures.

SUMMARY

A system and method for retrofitting conventional lighting fixtures, such as retrofitting lighting fixtures using LED illumination systems that maximize the benefits of LEDs, is described. In some embodiments, the system includes a mount, or mounting component, and a printed circuit board that includes multiple light emitting diodes (LEDs).

In some embodiments, the mount includes two or more angled faces in which printed circuit boards having multiple LEDs are attached, in order to provide a desired spread of illumination below a lighting fixture, among other benefits.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein:

FIG. 3A is a perspective view of an embodiment of a retrofit LED assembly which may be used to convert a fluorescent fixture into an LED lamp;

DETAILED DESCRIPTION

As described herein, in some embodiments, a system and method for incorporating LEDs into existing lighting environments is described.

Figure 1:
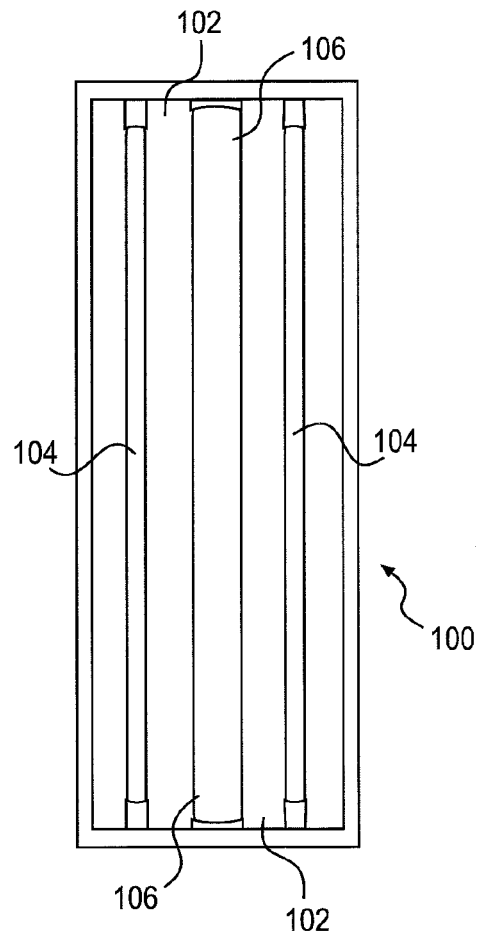
FIG. 1 is a view of a conventional fluorescent lighting fixture which can be subjected to the systems and methods of the disclosed embodiments.
Figure 2:
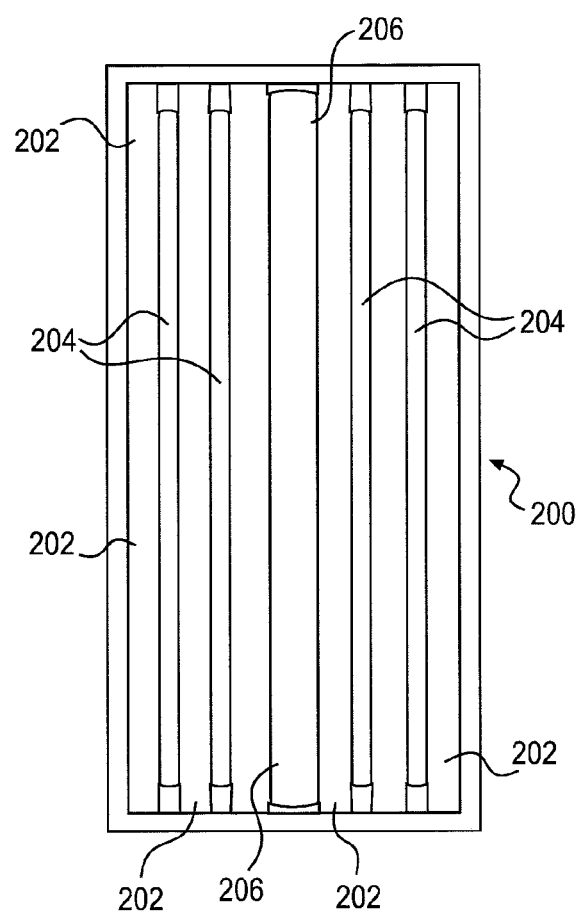
FIG. 2 is a view of another conventional lighting fixture which may be subjected to the systems and methods of the disclosed embodiments.
Figure 3B:
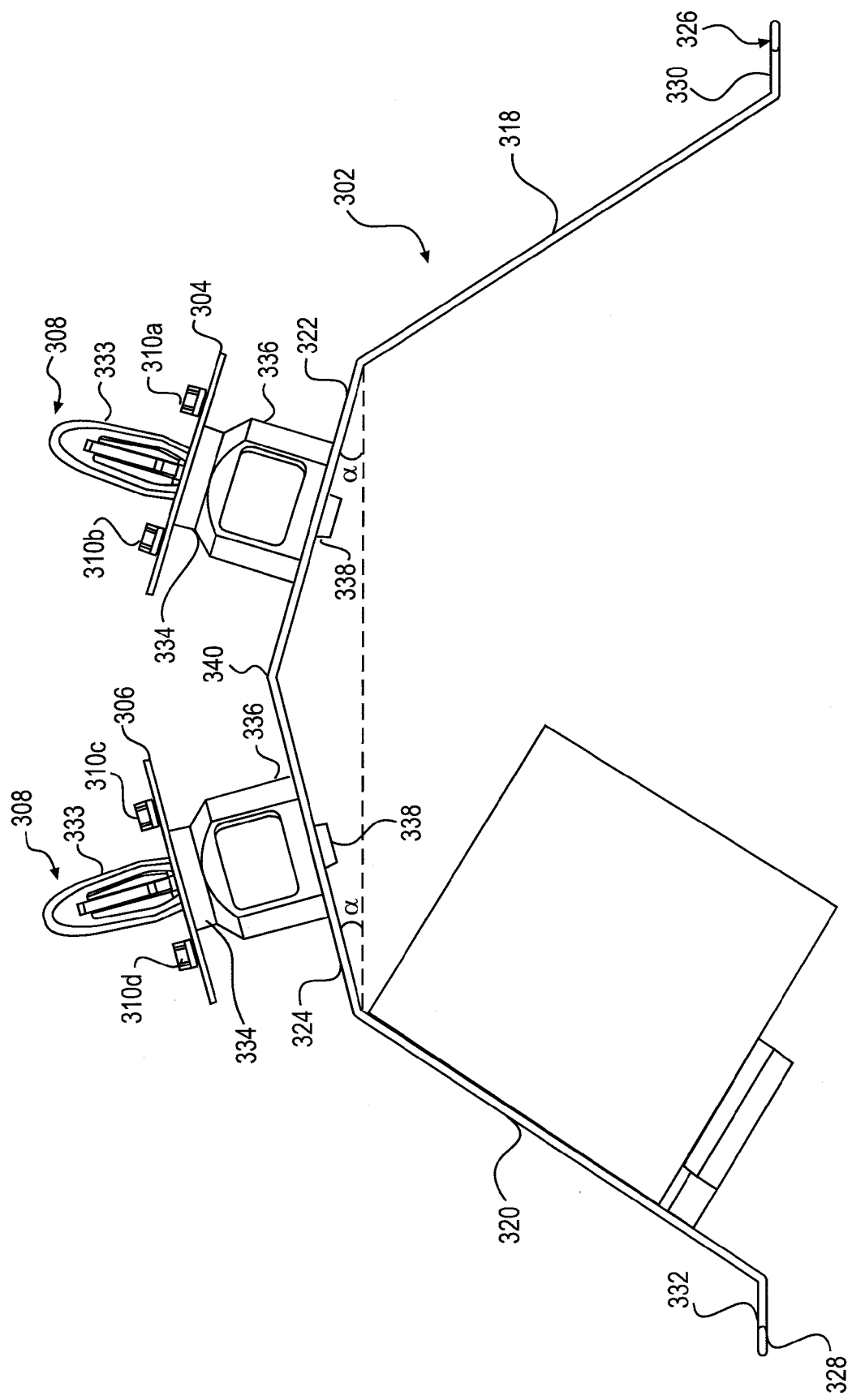
FIG. 3B is an end view of the assembly shown in FIG. 3A.
Figure 3C:
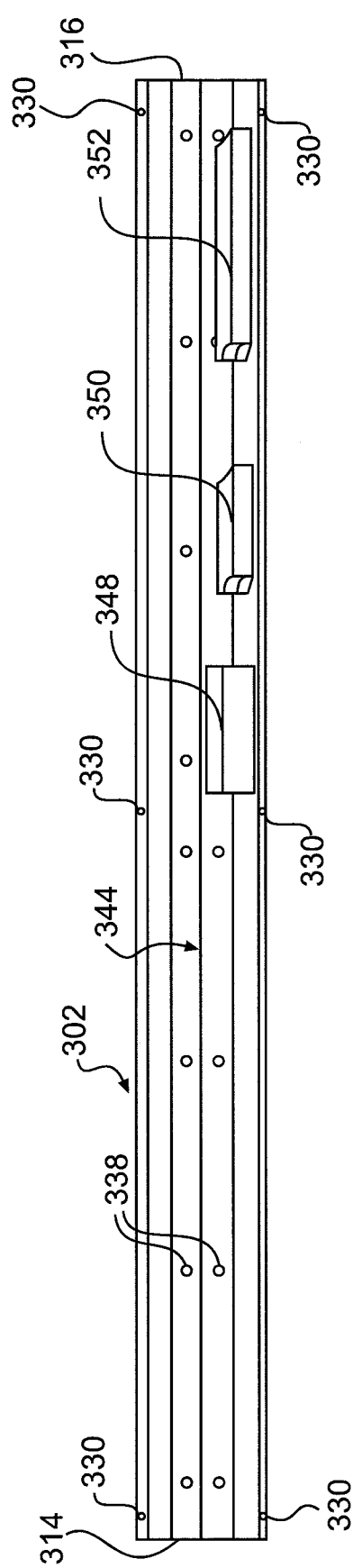
FIG. 3C is an underside view of the assembly shown in FIG. 3A.

FIGS. 3A-C show a lighting assembly 300 that is configured to be mounted into numerous existing fluorescent fixtures for retrofitting purposes. Looking first at FIG. 3A, we see a mounting component or mount 302, which may be constructed of sheet metal. Mount 302 is used to support a first elongated printed circuit board (PCB) 304 of LEDs and a second elongated PCB 306 of LEDs. As described in more detail herein, the boards 304 and 306 may be constructed of multiple smaller LED boards that are connected together using PCB connector blocks. Thus, each of the two elongated boards 304 and 306 are, in some embodiments, formed of smaller boards.

The two elongated boards 304 and 306 are mounted atop the mount 302 using non-conductive PCB spacer fasteners 308. The spacer fasteners 308 support each of the elongated PCB boards 304 and 306 at a slight distance above upper angled surfaces of the mount 302. The fasteners 308 may be constructed using flame-retardant nylon. The structural details regarding these fasteners 308 are discussed herein.

Multiple LEDs 310 are included on each of the boards 304 and 306. For example, in some embodiments, the selected LEDs are six ohm, 3.5 volt, 20 milliamp, 92% efficient, LEDs, with suitable LED dies. These dies may be commercially available.

FIG. 3A also depicts certain configurations, or groupings, of multiple LEDs 310 on boards 304 and 306. For example, in some embodiments, the boards 304, 306 may include a first group of LEDs 310*a* as well as a second group of LEDs 310*b*. In some cases, the LEDs are broken into groups of six LEDs for a variety of reasons, such as for separate operational purposes. One skilled in the art will recognize, however, that various different sizes of groups could be used to accomplish different purposes. It should also be understood that although only two groups (310*a* and 310*b*) have been identified in FIG. 3A, the rest of the remaining LEDs could also be broken out in to a variety of groupings to accomplish dimming, directional lighting, contrasted lighting arrangements or patterns and/or other desired light-controlling objectives.

Referring again to FIG. 3A, the first board 304 and second board 306 extend from a first end 314 to a second end 316 of the mount 302. At the first end 314, the mount 302 includes a pair of power supply terminals 312 shown at both ends of each of boards 304 and 306. These terminals 312 may be electrically connected to a variety of power sources, such as AC primary power, emergency AC backup power, and/or DC battery backup power, using wires or other conductor pair arrangements. The LEDs 300, including LED groups 310*a* and 310*b*, may be controlled using circuitry existing on the back of the boards 304 and 306. Further details regarding various circuitry arrangements are described herein.

As described herein, in some embodiments, the mount 302 is configured to include two or more angled faces onto which the board 304 and 306 are attached. FIG. 3B depicts a cross-sectional view of the mount 302. The mount 302 includes an angled face 318 on a first side, and another angled face 320 on the opposite side. Above face 318, a face 322 exists at an angle $\alpha$ relative to horizontal. In some embodiments, angle $\alpha$ falls within the range of 15 degrees, plus or minus 10 degrees. In some embodiments, angle $\alpha$ falls within the range of 15 degrees, plus or minus 5 degrees. In some embodiments, angle $\alpha$ falls within the range of 15 degrees, plus or minus 3 degrees. In some embodiments, angle $\alpha$ falls within the range of 15 degrees, plus or minus 1.5 degrees. In some embodiments, such as those depicted in FIG. 3B, angle $\alpha$ is about or approximately 15 degrees. Having such ranges, the mount 302 provides a desired spread of illumination emitted by the LEDs based on an average ceiling height. Therefore, different angles may be more desirable, depending on ceiling height and/or other parameters.

The opposite side of the mount 302 is symmetrical in that immediately above face 320 is a face 324 that is also at angle $\alpha$ relative to horizontal. At the bottom of mount 302 there are two opposing flanges 326 and 328 which extend out horizontally and rest atop the inside housing of a fixture being retrofitted. The mount 302 may be fastened inside a housing of the fixture by self-tapping fasteners (not shown) that are screwed through holes 330 and 332 bored through the flanges 326 and 328, respectively.

The boards 304 and 306 each rest atop a platform portion 334 provided on each of fasteners 308. These platform portions 334 are on top of a body portion 336 of each fastener 308. The top portions 333 of each fastener can be forced through holes formed in the end of each sub-board (e.g., boards 354, 356, 358, and 360 of FIG. 3A). On the bottom of each fastener 308 is an insertable snap-lock tab 338, which may be inserted through a hole made through the faces 322 and 324 which are set at an angle. This secures each fastener 308 to the top of the mount 302 in an upright position as shown.

As described herein, the angle $\alpha$ of faces 322 and 324 of the mount 302 facilitates a desired illumination spread when the assembly is mounted into an existing fixture. In some embodiments, the assembly 300 may facilitate a real-time or current adjustment of the faces 322 and 324 with respect to one another. The mount 302 may include a pivot component 340 configured to enable an adjustment of angle $\alpha$ during a retrofit of a fixture. That is, in some embodiments, the mount 302 may be adjustable before, during, and/or after a retrofit into an existing fixture.

FIG. 3C shows an underside view of the mount 302. In this view an undersurface 344 exposes three devices—an emergency battery 348, an emergency power supply 350, and a main power supply 352. The devices (348, 350, and 352) can be fastened to the underside of the mount 302 using adhesives, fasteners, and/or other attachment components. Main power supply 352, such as a universal AC input, is used to tap into an existing power source in a building or other structure. Under normal operation, this device receives power from a power source in the building, and then supplies power to the LEDs 310—so long as there is power to the building. In cases when the primary power to the building is lost, and assuming that the building is the sort that has an emergency backup AC power source, emergency backup power supply 350 may be used to supply AC power to the LEDs, such as to a reduced number of the LEDs 310. In cases where all AC sources are not available, battery 348 and associated DC power supply 350 will be brought into action and used to illuminate a reduced number of operational LEDs on the mount 302.

Depending on the circumstances, there are numerous ways that the emergency lighting could be accomplished. In some embodiments, all of the LEDs 310 are active when the device is receiving power from the primary AC source (via power supply 352). Alternatively, a small number of the LEDs 310 will not be illuminated when the device is receiving the primary source of AC from the building. That is, only 310*a* and 310*b* could be configured to not illuminate when the primary source of AC power is available from the building. This smaller "emergency" group of LEDs would only illuminate when the primary source of AC is not available. For example, 80% of LEDs may be included in the primary group, and 20% may be included in the backup group. In this example, the 20% of the LEDs are not used in normal operation, and are only illuminated when there is a total power failure.

In some embodiments, all of the LEDs 310 could be used in normal operation. Then, upon a total AC power failure, emergency power supply 350 and possibly battery 348 could be used to activate the limited emergency group (some of the same LEDs used during normal operation) for the emergency purposes. For example, both of groups 310*a* and 301*b* (twelve LEDs total) may be the LEDs illuminated during the emergency.

Figures 4A, 4B:
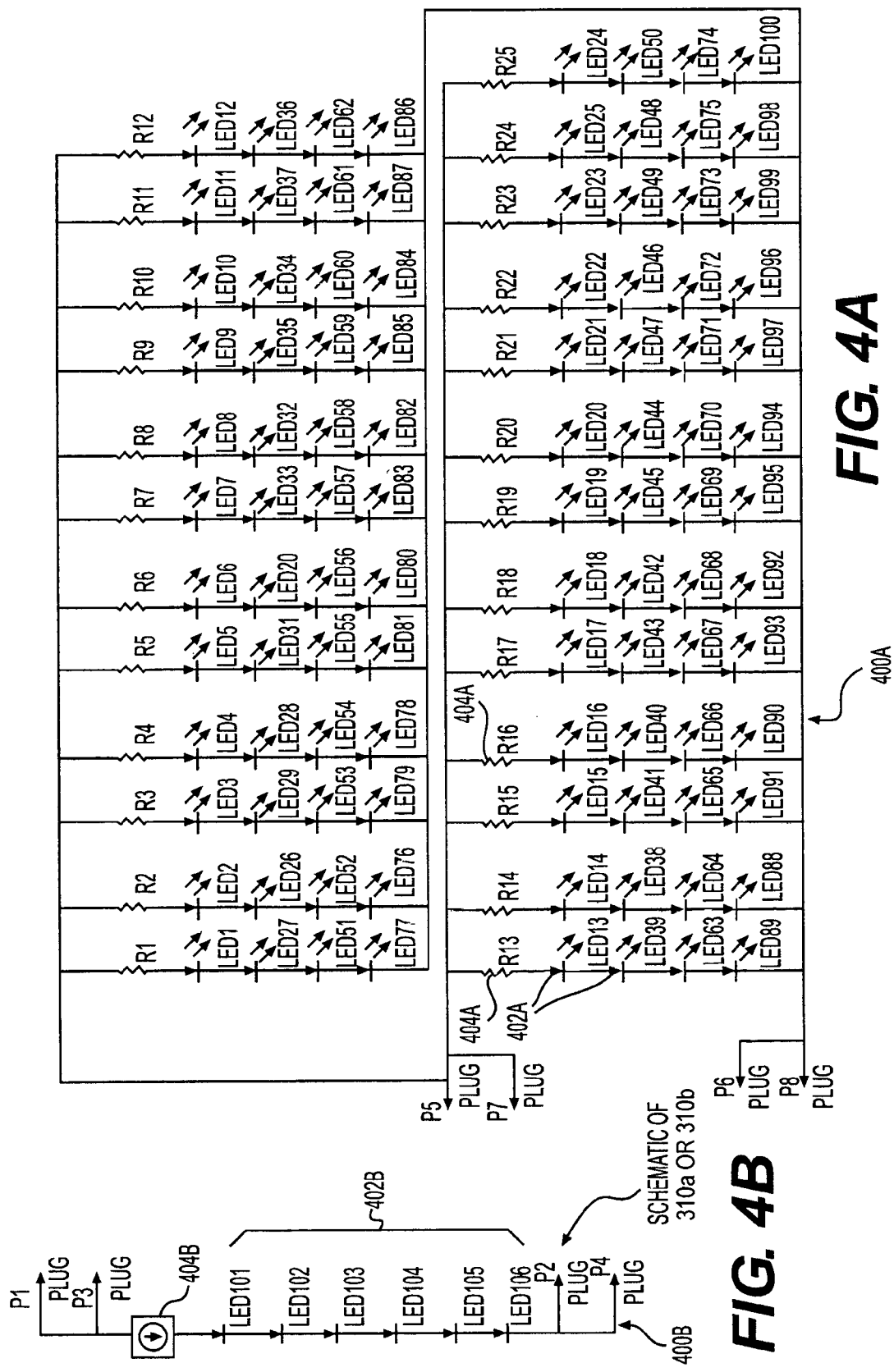
FIGS. 4A-C are three alternative schematic arrangements used to power the LED lamps.
Figure 4C:
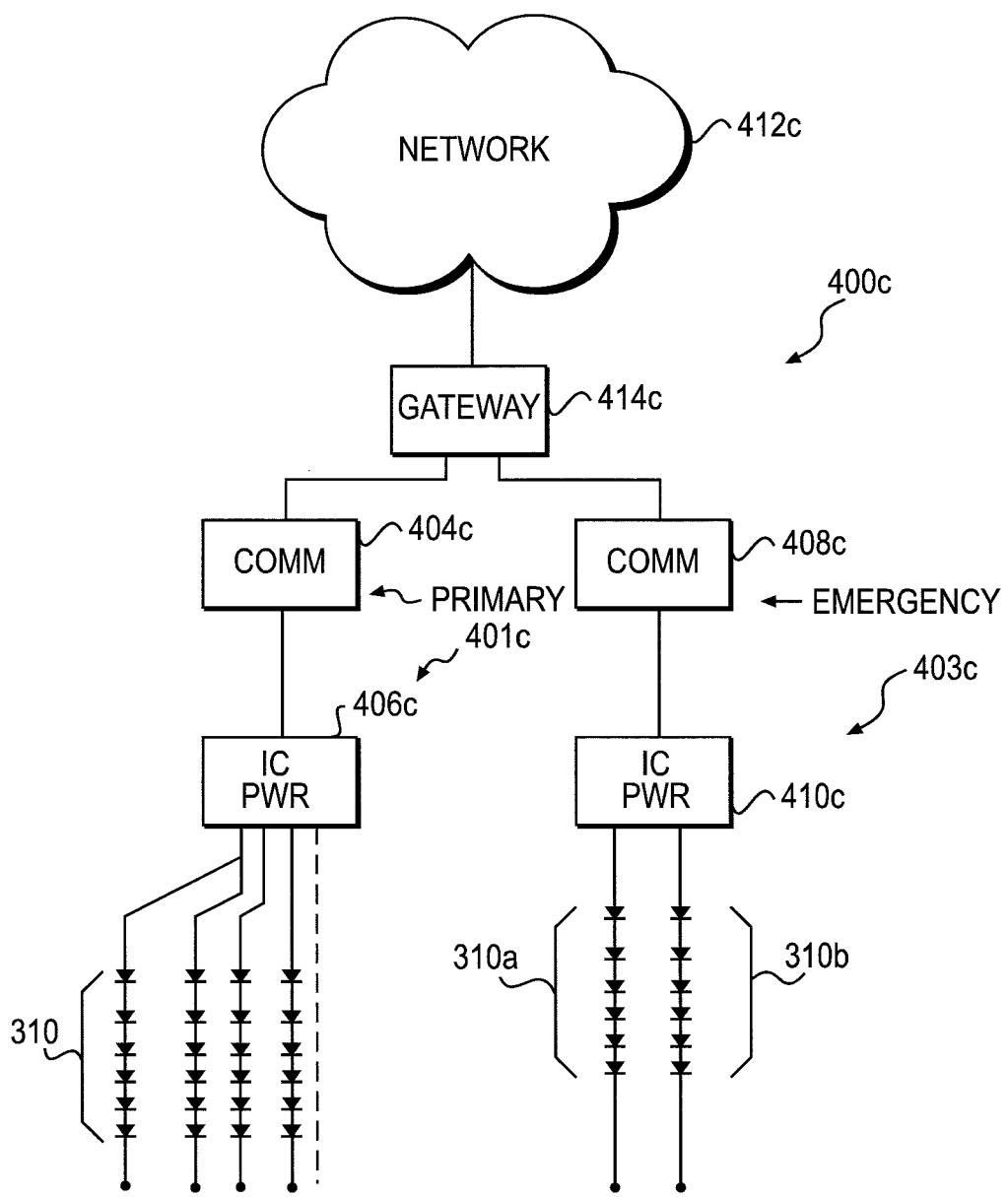

As described herein, a variety of circuitry arrangements may be utilized when illuminating LEDs on the boards 304 and 306 of the retrofit lighting assembly 300. FIGS. 4A-C show various embodiments for the circuitry used to deliver and control power to the LEDs. This circuitry would be included on the reverse side of the PCBs.

Referring to FIG. 4A, multiple LED strings are placed into parallel arrays, each string including four LEDs 402*a* and having a resistor 404A. The use of the resistor 404A provides a constant brightness arrangement in which the overall device will not be dimmable. Additionally, this arrangement may not support the selecting illumination of different groups of LEDs. Thus, although suitable for operation, FIG. 4A depicts a basic, cost-effective circuitry arrangement.

FIG. 4B depicts a six LED arrangement 402B, which is supported by a linear driver 404b. These devices allow for the delivery of the necessary current for driving LEDs 402b, and may be more efficient with respect to the arrangement shown in FIG. 4A.

FIG. 4C depicts a circuitry arrangement that facilitates the dimming of the lighting assembly. To do this, it includes a communications microprocessor 404c and a smart multichannel linear LED driver 406c. The power administered through driver 406c is controlled using the communications microprocessor 404c, and may be fully networked.

This arrangement includes a primary side 401c, and an emergency side 403c. For the primary side 401c, the communications processor 404c is used to control a smart multichannel linear driver 406c to operate the primary group of LEDs 310. This primary group may include of all of the LEDs 310, or only the LEDs 310 not included in the smaller groups 310a and 310b. Regardless, the linear driver 406c receives a communicated signal from communication processor 404c to turn the primary set of LEDs on or off. These LEDs would be "on" when the primary source of AC power is available. The communications processor 404c may also communicate with a network gateway 414c, which may be patched into a network 412c (e.g., the internet or an intranet arrangement). Thus, the LEDs 310 are able to be turned on or off via a personal computer, wireless device or any other networkable device.

On the emergency side 403c of the system, lighting of a reduced number of LEDs will occur in the event that the primary source of AC power in the building is down, and the AC emergency backup system or the DC battery backup are utilized. When these secondary sources of power are utilized, communications processor 408c activates driver circuit 410c to drive the emergency group or groups of LEDs (e.g. 310a and 310b). Since communications processor 408c is accessible through gateway 414c, it is totally networkable. Thus, when desired, LED groups 310a and 310b can be independently activated (or not) over the network 412c.

In some embodiments, groups 310a and 310b are not also included in the primary side 401c of the circuit. The two sides 401c and 403c are completely independent, and the LED groups 310a and 310b will only be activated in the event of an emergency. In an alternative embodiment, groups 310a and 310b are also included on the primary side 401C of the circuit, and may be illuminated not only in backup situations, but also when AC primary power is available.

In some embodiments, the circuitry arrangement may be configured to provide independent control of the left and right strings of LEDs or combination of LED strings, allowing one to be turned off while one remains illuminated, or to have both LED strings "ON" or "OFF". Incorporating a dimmer-switch board, the circuitry arrangement facilitates such a bi-level dimming capability of each elongated LED board and provides a light output at the levels of 0%, 50%, and/or 100%. When power is cycled to the elongated LED board, within a short amount of time this change may be detected by a power loss detection circuit on the dimmer-switch board, which sees this change as a signal to alternate the dimming state of the elongated LED board from both LED strings "ON" or both strings "OFF" to one string "ON" and one string "OFF" (delivering 50% light output). When power is turned off for longer than a predetermined length of time, the dimmer-switch board will reset its dimming state such that 100% of the LED strings will be on the next time the elongated LED board is powered on. Because the individual elongated LED boards can be controlled on a per strip basis, the number of dimming steps can be expanded per application.

In some embodiments, the circuitry arrangement may be configured to facilitate switching the reception of power from the electric grid to a battery backup during peak electrical usage hours, thereby removing the electrical load that the elongated LED board would typically put onto the electric grid. The system will be able to switch back to being powered from the electrical grid after peak usage hours. The battery backup will automatically charge during predetermined low usage hours and will also run on a staggered or random charging schedule during these low usage hours to avoid all of the lighting systems trying to charge simultaneously, which may place an undesirable heavy load onto the electric grid. The battery backed up elongated LED boards may also switch back onto the electrical grid on a staggered or random schedule to further avoid putting an undesirable heavy load onto the electric grid. The nighttime energy harvesting system may be able to automatically compensate for daylight savings and other time change occurrences via an onboard RTC (real time clock) chip that will keep track of the time and date, or by a manual adjustment via an external control mechanism, among other things. The nighttime energy harvesting system will also have an emergency power save feature that will switch the elongated LED board back onto the electrical grid regardless of the time of day if the battery backup reaches a certain percentage below "fully charged". This feature thereby ensures that, in case of emergency, the elongated LED board will still have a reserve of power to energize itself for a period of time.

The switching of the reception of power from the electric grid to a battery backup could also be done by receiving a signal electronically or wirelessly over network 412c. For example, an entity, during peak electrical usage hours, could transmit one or more signals to switch off power from the grid and for the LEDs 310, 310a, and/or 310b to operate on only battery power. Thus, the switching off and on of the LEDs could be done according to time tables established by the external entity itself (e.g., power provider). Further, this remote switching ability could be executed dynamically by the power company. For example, upon the detection of a particular spike in consumption, the entity could immediately react and compensate by remotely causing the FIG. 4C system, as well as a plurality of other like systems, to go off grid. This would enable the entity, e.g., power company, to dynamically flatten energy consumption by causing customers to switch to battery power at the time of need. Then, once consumption returns to lower levels, the entity could remotely return the LEDs to the grid power source and recharge the batteries.

As described herein, the elongated boards 304 and 306 may be formed of multiple PC boards. FIGS. 5A-G depict various configurations in which smaller PC boards (e.g., boards 354, 356, 358, and 360) may be connected together to comprise two elongated boards 304 and 306.

In some embodiments, in order to connect two smaller boards to one another, a connector board 502 is used to both physically join the two abutting ends, such as ends 504 and 506 of boards 354 and 356, respectively. On each of ends 504 and 506, pin receiving holes 508 and 512 are shown associated with traces 510 and 514. Traces 510 and 514 extend to the ends 504 and 506 of the boards. Alternatively, traces 510 and 514 may not be required, depending on the extent of the traces (e.g., traces 516) on the connector board 502. For example, when traces 516 on the connector board 502 are long enough to reach the pin receiving holds 508 and 512 on boards 354 and 356, the traces 510 and 514 will not be required.

Figure 5A:
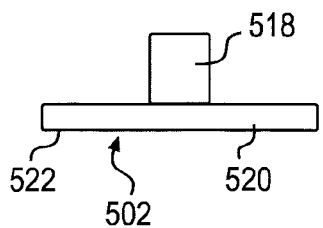
FIG. 5A shows a side view of a connector block used to electrically and physically connect two PCBs together at a joint.

In FIG. 5A, the connector board 502 includes a bottom portion 502 and a female receptacle 518. Female receptacle 518 is a well-known device, which includes pins and receives a plug connector, such as plug connector 530 shown in FIG. 5E.

Figure 5E:
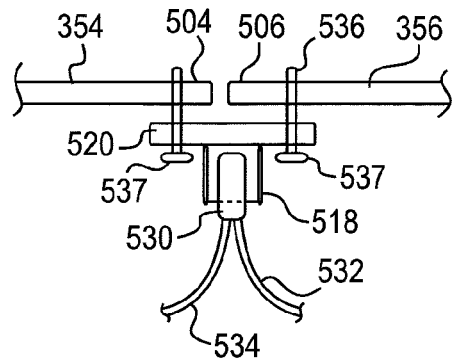
FIG. 5E shows a side view of a connector block installed between two PCBs.
Figure 5B:
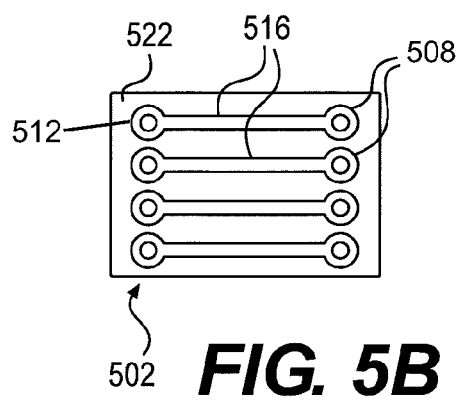
FIG. 5B shows a back side view of the connector block shown in FIG. 5A.

FIG. 5B depicts an engagement side 522 of bottom portion 502 of the connector board 502. On the engagement side 522, each of pin receiving holes 508 and 512 are interconnected by a plurality of parallel traces 516. These traces 516 will be used to electrically and signally connect the blurred ends to each other, as shown in more detail in FIG. 5E.

FIG. 5E depicts an connector board 502 that has been used to punch together two board ends 504 and 506 using pins 536. Pins 536 are used to conduct electrical power, transmit communications signals, and physically secure the boards 354 and 356 to each other such that the connection of all the smaller boards comprises the two elongated boards 304 and 306. As depicted, the female receptacle 518 extends downward after the interconnector board 520 has been pinned to each PCB end. Thus, a plug connector 530 can be inserted and secured in the receptacle 518 to make the necessary electrical connections.

Figure 5C:
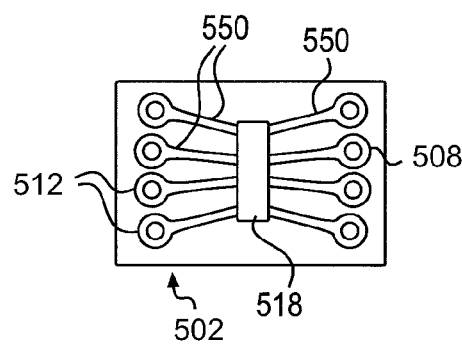
FIG. 5C shows a top view of an alternative connector block wherein the traces are included on the top of the block.
Figure 5F:
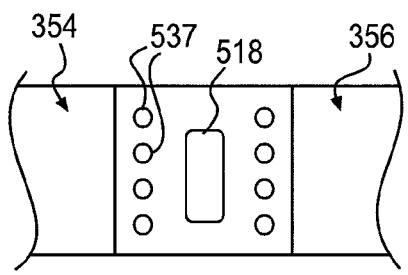
FIG. 5F shows a view of the connector block installed between two PCBs from below.
Figure 5D:
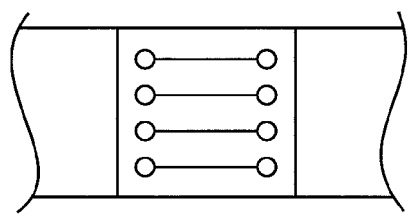
FIG. 5D shows a view of a connector block from above in place between two PCBs.
Figure 5G:
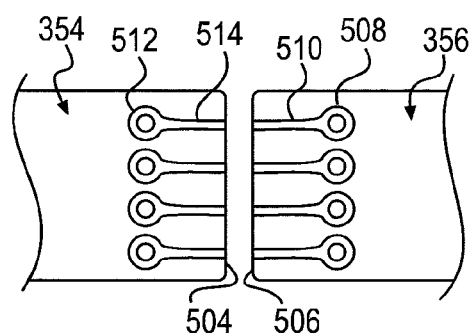
FIG. 5G shows the ends of two PCBs as they appear before the connector block is installed.

FIG. 5F depicts the interconnecting member 502 installed on the underside of board ends 354 and 356, showing the female receptacle 518 and the connecting pin heads 537. In FIG. 5F, the plug connector 530 has not yet been inserted.

FIG. 5C depicts an alternative tracing arrangement for the connector 502. In FIG. 5C, the traces 550 are on the same side of the connector board as the female receptacle 518. These traces are angled outward to meet up with the pin heads 537 upon installation.

Thus, in some embodiments, the small PC boards are connected with a variety of mechanisms to fix the boards to one another, to transfer electric current to one another, to communicate with one another, and so on. For example, utilizing the connections described in FIGS. 5A-5F, two connected PC boards may rotate with respect to one another, among other things.

Figure 6:
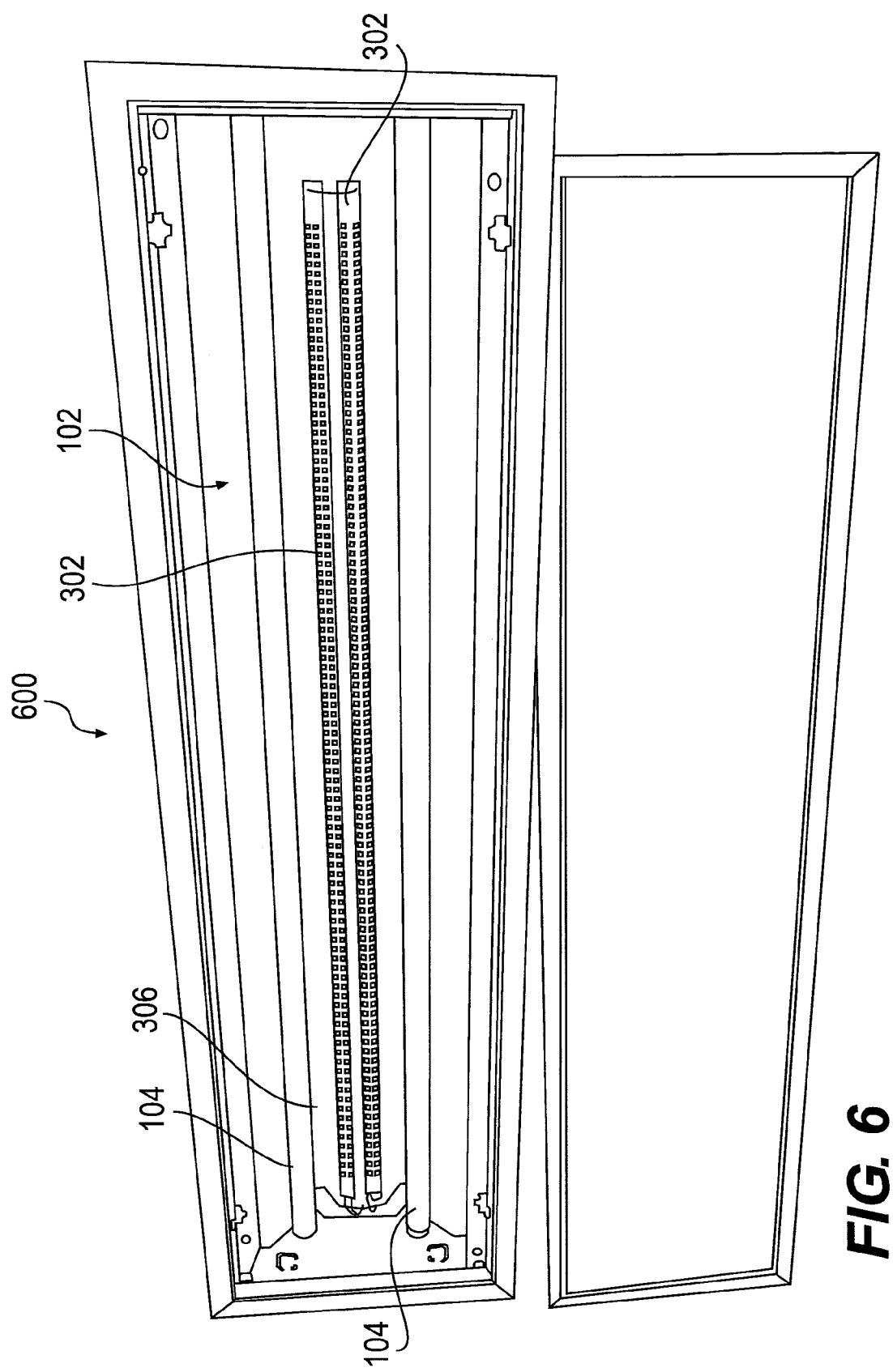
FIG. 6 is a perspective view of the fluorescent lamp housing shown in FIG. 1 after it has been subjected to the processes and systems of the disclosed embodiments.
Figure 7:
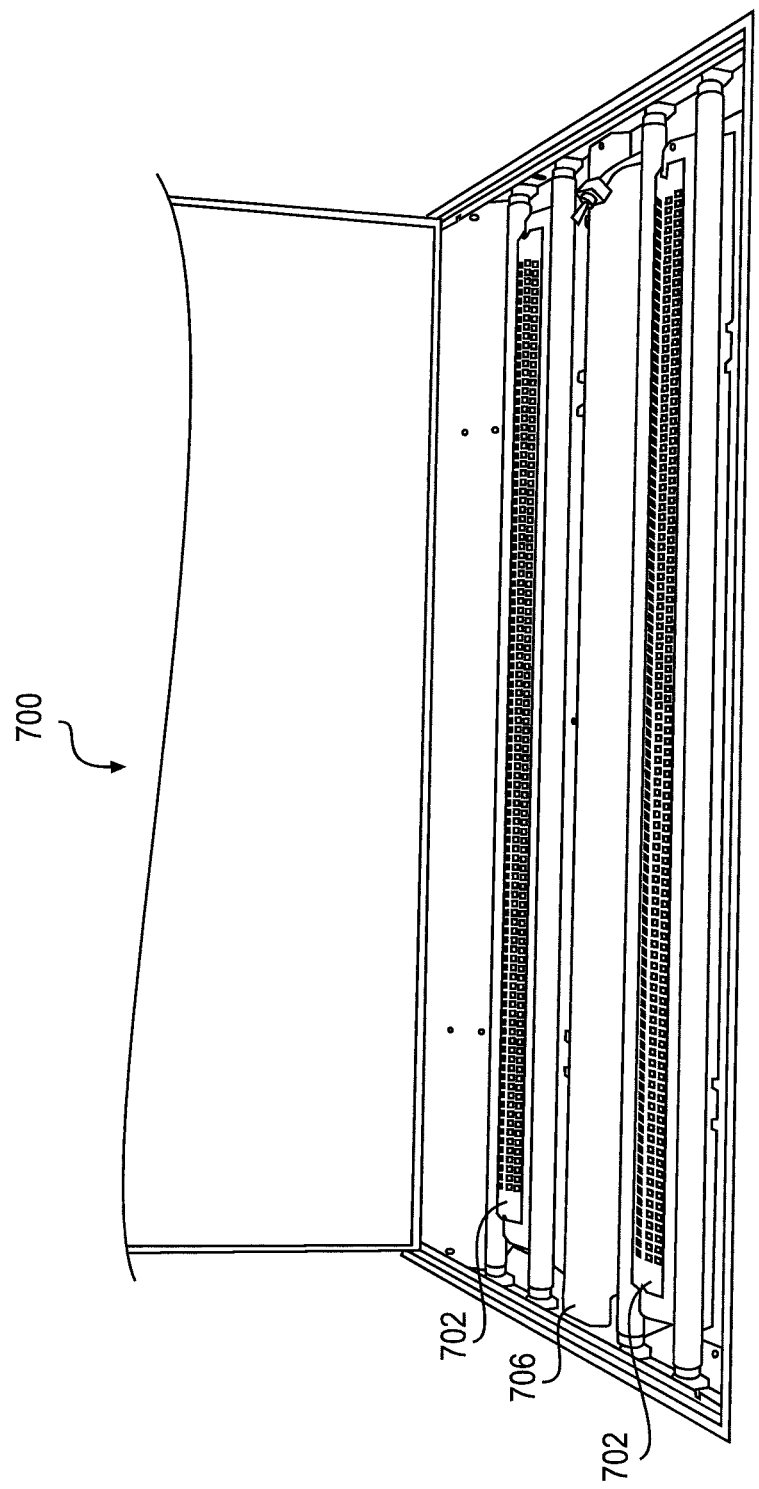
FIG. 7 is a perspective view of the fluorescent lamp housing shown in FIG. 2 after it has been subjected to the processes and systems of the disclosed embodiments.

As described herein, the mount 302 and attached PC boards 304 and 306 are configured to be installed into existing lighting fixtures, such as fluorescent tube lighting fixtures, in order to retrofit the lighting fixtures with an LED-based illumination system that provides desirable illumination patterns, among other benefits. FIG. 6 shows an installation of the retrofit device on mount 302 in an existing fluorescent housing. FIG. 7 shows a dual-installation where two retrofit devices are used to convert a four-bulb fluorescent light arrangement.

In some embodiments, in order to retrofit the lighting assembly 300 into an existing housing, such as fluorescent lamp housings 100 and 200, the following steps may be performed.

After shutting off power to the unit, the existing ballast equipment and the cover (e.g., cover 106) are removed, along with any remaining bulbs. However, in some cases ballast removal may not be necessary because of where the mount 302 is to be secured.

With respect to the assembly of FIG. 6, after the ballast and cover have been stripped from the unit, a single retrofit lighting assembly 300 is fastened into the space formerly occupied by the ballast equipment, and fasteners (e.g., screws, not shown) can be secured into the back of the housing through attachment holes 330.

With respect to the assembly of FIG. 7, since the ballast arrangement and cover 206 are located in the center of the housing and do not have to be removed, two separate duplicate versions 702 of the lighting assembly 300 can be fixed into the back of the housing as shown.

Once the lighting assemblies 300 have been installed, electrical connections are made. For example, connections are made from the building primary AC source and building emergency power supplies into power sources 352 and 350, respectively, and from each of the power sources 350, 352, and battery 348 into the PCB circuitry. Also, battery 348 may be electrically connected to the primary AC source so that it can remain charged. Once installed and electrically connected, the new retrofit devices (600 or 700) are ready for operation.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A remotely controllable illumination system comprising:
   a lighting assembly;
   a plurality of illumination devices on the assembly;
   a battery electrically connected to the illumination devices;
   means for connecting to an external power source;
   a switching system for, upon receipt of a remotely transmitted first signal, causing the external power source to be disconnected from the illumination devices, and causing the illumination devices to be powered solely by the battery;
   the switching system, upon the transmission of a remotely-transmitted second signal, causing the external power source to become reconnected and power the illumination devices; and
   a power save component which switches the illumination devices back to the external power source if the battery reaches a certain percentage of full charge.

2. The system of claim 1, wherein the assembly is adapted to receive the first and second signals electronically.

3. The system of claim 1 wherein the assembly is adapted to receive the first and second signals wirelessly.

4. The system of claim 1 wherein the external power source is an AC power grid.

5. The system of claim 1 wherein the illumination devices are LEDs mounted on two or more printed circuit boards.

6. The system of claim 5 wherein the printed circuit boards are oriented to direct light in an outward and downward direction.

7. The system of claim 6, further comprising a mount including two outwardly facing angled faces for supporting the printed circuit boards, the faces being at 15 degrees plus or minus 10 degrees away from horizontal in opposite directions.

8. The mount of claim 7, wherein the faces are at 15 degrees plus or minus 5 degrees away from horizontal.

9. The mount of claim 8, wherein the faces are at 15 degrees plus or minus 3 degrees away from horizontal.

10. The mount of claim 9, wherein the faces are at about 15 degrees away from horizontal.

11. A power-consumption reducing system comprising:
a plurality of LED illumination fixtures retrofitted into a variety of already existing lighting structures;
each of the LED illumination fixtures in the plurality being either connected or disconnected from an AC power grid source in response to externally transmitted signals;
a battery power source electrically supplying power to each of the plurality of fixtures when the AC power grid is disconnected;
a component which switches the illumination devices back to the external power source if the battery backup reaches a certain percentage of full charge.

12. A remotely controllable illumination apparatus comprising:
an illumination device;
a battery electrically connected to the illumination device;
a system for connecting to an external power source;
a switching system which can optionally cause the external power source to be disconnected from the illumination device, and power the illumination device using the battery;
the switching system optionally enabling the external power source to become reconnected and power the illumination device; and
a power save component which switches the illumination device back to the external power source if the battery reaches a certain percentage of full charge.

* * * * *